United States Patent [19]

Jargiello

[11] 4,326,018

[45] Apr. 20, 1982

[54] LITHOGRAPHIC PRINTING PLATE

[75] Inventor: Paul Jargiello, Orange, N.J.

[73] Assignee: Polychrome Corporation, Yonkers, N.Y.

[21] Appl. No.: 178,657

[22] Filed: Aug. 15, 1980

Related U.S. Application Data

[63] Continuation-in-part of Ser. No. 58,976, Jul. 20, 1979, Pat. No. 4,233,390, which is a continuation-in-part of Ser. No. 859,967, Oct. 6, 1977, abandoned.

[51] Int. Cl.³ .................... G03F 7/02; G03C 1/58; G03C 1/76
[52] U.S. Cl. .................. 430/15; 430/9; 430/17; 430/145; 430/156; 430/302; 430/328; 430/330
[58] Field of Search ............... 430/328, 330, 302, 156, 430/9, 145, 15, 17

[56] References Cited

U.S. PATENT DOCUMENTS

| | | | |
|---|---|---|---|
| 2,692,826 | 10/1954 | Neugebauer et al. | 430/309 |
| 3,506,440 | 4/1970 | Sugimoto | 430/328 |
| 3,578,451 | 5/1971 | Doggett | 430/302 |
| 3,669,664 | 6/1972 | Adams | 430/302 |
| 3,679,412 | 7/1972 | Guthrie et al. | 430/302 |
| 3,833,373 | 9/1974 | Hazenbosch et al. | 430/330 |
| 4,063,507 | 12/1977 | Toyama et al. | 430/302 |
| 4,093,461 | 6/1978 | Loprest et al. | 430/330 |
| 4,233,390 | 11/1980 | Jargiello | 430/502 |

Primary Examiner—Mary F. Downey

[57] ABSTRACT

An improved lithographic printing plate prepared by exposing a lithographically suitable photosensitive sheet material through a mask or transparency, to radiation, developing the exposed sheet to remove unexposed light sensitive material and post-curing the developed sheet by exposure to high intensity radiation or air-baking at high temperatures.

14 Claims, No Drawings

LITHOGRAPHIC PRINTING PLATE

CROSS REFERENCE TO RELATED APPLICATION

This application is a continuation-in-part of co-pending U.S. application Ser. No. 6/058,976 filed July 20, 1979, now U.S. Pat. No. 4,233,390 which is a continuation-in-part of U.S. application Ser. No. 859,967 filed Oct. 6, 1977, and now abandoned.

BACKGROUND OF THE INVENTION

This invention relates to improved lithographic printing plates and a novel method for their preparation. More particularly this invention comprises an aluminum based lithographic printing plate prepared by exposing an aluminum base sheet upon which has been coated, either separate layers or in an admixture, a lithographically suitable light sensitive diazo compound and a photopolymerizable composition, to radiation through a mask or transparency, developing said exposed plate and finally post-curing said developed plate by exposure to high intensity radiation or air-baking at high temperatures.

It is well recognized that a substantial amount of lithographic printing plates are prepared by exposing an aluminum based photosensitive plate composition to radiation, developing said exposed plates and post-curing the developed plates by further exposure to the first radiation source for longer periods of time.

Among the disadvantages of plates of this type are short press lives, low image durability and resolution.

The instant invention provides an improved lithographic plate and a method for its preparation wherein a photosensitive plate, after exposure through a mask or transparency and development is post-cured by short-term exposure to high intensity radiation or air-baking at elevated temperatures. The resulting lithographic printing plates demonstrate long press lives and high image durability and resolution.

DESCRIPTION OF THE PRIOR ART

It is well known in the prior art to prepare lithographic printing plates by exposure of light-sensitive sheet materials comprising a metal base sheet coated with a light-sensitive diazo composition and a photopolymerizable composition, either as separate layers or as an admixture, to radiation, development of said exposed sheet and further exposure of the developed sheet to said radiation for longer times to effect post-curing of the image. The resultant lithographic printing plates have poor press lives and image durability as measured by weight loss after immersion of the post-cured plate in a polar solvent, e.g., dimethylformamide. The instant invention provides a lithographic printing plate of increased press life and image durability and a process for its preparation.

SUMMARY OF THE INVENTION

The present invention provides an improved lithographic printing plate and a process for its preparation.

The lithographic printing plate comprises a light-sensitive sheet material which has been exposed through a mask or transparency to a radiation source, developed by removal of the unexposed light-sensitive coating and post-cured by exposure to high intensity radiation or air-baking at high temperatures for a short time period.

The light-sensitive sheet materials which may be used in the instant invention include the aluminum sheets coated with a first layer comprising a lithographically suitable diazo composition and a second layer comprising a lithographically suitable photopolymerizable composition. Such light-sensitive sheet materials are described in U.S. Pat. No. 3,905,815 issued to Bonham and in my co-pending application Ser. No. 58,976 filed July 20, 1979.

It has been found that the plate produced by the instant process is extremely durable, long lasting and of high resolution.

It is therefore, an object of the present invention to provide an improved printing plate having an extremely long press life, high image durability and resolution.

It is a further object of the present invention to provide a lithographic printing plate having cleaner running characteristics and therefore producing sharper printed images over its lifetime.

These and other objects of this invention will be in part discussed and in part apparent upon examination of the detailed description of the preferred embodiment.

DETAILED DESCRIPTION OF THE PREFERRED EMBODIMENT

As hereinbefore mentioned, the present invention provides for a commercially acceptable, extremely long running lithographic printing plate.

As the first step in the production of the lithographic printing plate, a sheet metal substrate such as zinc, copper or most preferably aluminum and the alloys thereof, especially those aluminum compositions suitable for the manufacture of lithographic printing plates such as, Alcoa 3003 and Alcoa 1100, which may or may not have been pretreated by standard pretreatments such as, graining and/or etching and/or anodizing techniques as are well known in the art, and also may or may not have been treated with a composition suitable for use as an interlayer for lithographic plates is coated with a radiation sensitive diazo composition and a photopolymerizable composition, either in separate layers or as an admixture, to produce a photosensitive sheet material.

The photosensitive sheet material is then exposed, through a mask or transparency, to a radiation source and the exposed sheet then developed for removal of unexposed photosensitive materials. The developed sheet is then post-cured by exposure to high intensity radiation or air-baking at high temperatures for short periods of time to yield the desired lithographic printing plates.

Interlayer compositions employable in the practice of this invention include aqueous solutions of alkali silicate, silicic acid, the Group IV-B metal fluorides, polyacrylic acid, the alkali zirconium fluorides, such as, potassium zirconium hexafluroide, or hydrofluozirconic acid in concentrations of 0.5% to 20% by volume coated by spraying, brushing, dipping or other equivalent means.

Preferred photosensitive sheet material compositions include the dual layer coated base materials described in my co-pending application, Ser. No. 58,976, supra, and U.S. Pat. No. 3,905,815 issued to Bonham.

In a preferred embodiment the photosensitive sheet material comprises the dual layer coated described in application Ser. No. 58,976, supra, wherein the lower diazo layer is applied at a coating weight of from about 5 to about 70 mg/sq. ft. and the upper photopolymerizable layer is coated at a weight of about 50 to about 800 mg/sq. ft.; and said coated sheet is exposed and developed as described in said application. The developed sheet is then post-cured by exposure to high intensity radiation or air-baking for a short time to produce the desired lithographic printing plate.

In a more preferred embodiment the diazo composition is coated at a weight of about 10 to about 30 mg/sq. ft. and the polymerizable composition at a weight of about 300 to about 600 mg./sq. ft.

In a preferred embodiment the developed plate is post-cured by air-baking at about 400° F. to about 500° F. for about 5 minutes to 30 minutes.

In a more preferred embodiment the developed plate is post-cured by air-baking at 500° F. for about 5 minutes.

In a still more preferred embodiment the developed plate is post-cured by exposure to a 50 to 200 watt/in UV lamp, at a distance of about 2 to about 6 inches, for about 10 seconds to 2 minutes.

In a most preferred embodiment the developed plate is post-cured by exposure to a 100 watt per inch mercury vapor lamp for 15 seconds at a distance of three inches.

The following non-limiting examples demonstrate the operation and intent of the invention.

EXAMPLE 1

A grained, andoized sheet of Alcoa grade 1100 aluminum is first coated with a compound which is the reaction product of paradiazo diphenylamine with paraformaldehyde at a coating weight of 30 mg./sq. ft. The thus treated substrate is then coated with a composition which comprises:

| | |
|---|---|
| Uvimer 530 (ethylenically unsaturated polyurethane available from Polychrome Corp.) | 12 g |
| Cellulose acetate phthalate | 4 g |
| ABS-300 (available from Dow Chemical Co.) | 2 g |
| Acryloid A-21 (available from Rhom & Haas) | 6 g |
| Benzophenone | 5 g |
| Michler's Ketone | .5 g |
| Hexaarylbiimidizole | .5 g |
| p-phenol sulfonic acid sodium salt | .4 g |
| Orasol GN dye | .4 g | in a solvent system of 60 ml methyl cellosolve and 200 ml of methyl ethyl ketone at a coating weight of 500 mg./sq. ft. The thus produced lithographic printing plate was exposed through a photographic transparency on a 5KW Berkey ultraviolet light source of 30 seconds and developed with Polychrome's 982 aqueous alkali developer. The developed plate was then post-cured by air-baking at 500° F. for 5 minutes. The thus produced printing plate provided 400,000 acceptable reproductions.

EXAMPLE 2

A coated substrate prepared as in Example 1 was baked in a 60° C. oven for 6 days (corresponding to a shelf-life of 5 years), prior to exposure to radiation, development and post-cure by air-baking. The resultant lithographic printing plate was acceptable.

EXAMPLE 3

A lithographic printing plate was prepared as in Example 1 except that the p-phenolsulfonic acid, sodium salt was excluded from the coating composition and the coated substrate was baked in the 60° C. oven for only one day (corresponding to a shelf-life of about one year) prior to exposure to radiation, development and post-curing by air-baking. The resultant lithographic printing plate exhibited only marginal commercial acceptability.

EXAMPLE 4

Two developed printing plates prepared as described in Example 1 were post-cured by exposure to a Conrad-Hanovia 100 watt per inch Hg vapor lamp (Englehard Industries) for 5 and 45 seconds, respectively. The resultant plates had long press lives.

EXAMPLE 5

Durability of the image on a lithographic printing plate is determined by;
 (a) weighing a 4"×4" section of such a plate;
 (b) immersing the weighed sample in dimethylformamide for 1 hour at 22° C.;
 (c) drying the sample, after immersion, for 20 minutes at 100° C.; and,
 (d) reweighing to determine weight loss.

Image loss, a measure of image durability, is proportional to the weight loss.

The results of such determinations on the lithographic printing plates prepared according to Examples 1 to 4 and a non-postcured plate, as a control, are as follows:

| Post-Curing Treatment | % Image Loss |
|---|---|
| None | 75 |
| UV exposure for 5 seconds | 4 |
| UV exposure for 45 seconds | 1 |
| Air-baking @ 500° F. for 5 minutes | 5 |

It is, of course, to be understood that the foregoing disclosure is intended to illustrate the invention and that numerous changes in the conditions and proportions can be set forth without departing from the scope of the invention as disclosed and defined in the claims appended hereinafter.

What is claimed is:

1. A lithographic printing plate which comprises a light-sensitive sheet material which has been imagewise exposed to a radiation source, the exposed plate developed and the developed plate post-cured by further exposure to a high intensity radiation source or air-baking at high temperatures wherein the light sensitive sheet material comprises a sheet substrate upon which had been coated a first layer comprising a photosensitive lithographically suitable diazo compound and a second layer comprising a lithographically suitable photopolymerizable composition.

2. The plate according to claim 1 wherein the photopolymerizable composition comprises the admixture of, in percent by weight of the photopolymerizable composition:
 (a) an acrylonitrile butadiene styrene resin in an amount of from 2% to 25%; and
 (b) one or more resins selected from the group consisting of solid acrylic, polyurethane and polyamide resins in an amount of from 4% to 50%; and
 (c) cellulose acetate phthalate in an amount of from 4% to 50%; and
 (d) one or more ethylencially unsaturated monomeric or oligomeric compounds having on the average, more than one double bond, and being capable of forming a high polymer by free radical addition photopolymerization, in an amount of from 20% to 60%; and (e) a photoinitiator capable of generating free radicals in an amount of from 0.5% to 45%; and (f) p-phenol sulfonic acid sodium salt in an amount of from 0.4% to 5%.

3. The lithographic printing plate of claim 2 wherein the photopolymerizable composition further comprises ingredients, in minor amounts, selected from the group consisting of, colorants, polymerization inhibitors, and fillers.

4. The lithographic printing plate of claim 3 wherein the colorant is a dye, and the filler is fine silica.

5. The lithographic printing plate of claim 2 wherein the photoinitiator is comprised of at least one component selected from the group consisting of benzophenone, Michler's Ketone and O-chlorohexarylbiimidizole.

6. The lithographic printing plate of claim 5 wherein the photoinitiator comprises equal parts of benzophenone, Michler's Ketone and O-chlorohexarylbiimidizole.

7. The lithographic printing plate of claim 2 wherein the diazo coating weight is in the range of from 5 to 70 mg/sq. ft. and the coating weight of the photopolymerizable composition is from 50 to 800 mg./sq. ft.

8. The lithographic printing plate of claim 2 wherein the diazo compound is the condensation product of paradiazo diphenyl amine with formaldehyde or paraformaldehyde.

9. The lithographic plate according to claim 1 or 2 wherein the post-cure was effected by exposing the developed plate to a 50 to 200 watt/in UV lamp at a distance of 2 inches to 6 inches for 10 seconds to 2 minutes.

10. The lithographic plate according to claim 9 wherein the post-cure was effected by exposure of the developed plate to a 100 watt/in. UV lamp, for 15 seconds, at a distance of 3 inches.

11. The lithographic plate according to claim 9 wherein the post-cure was effected by air-baking the developed plate at 400° F. to 500° F. for a period of 5 minutes to 30 minutes.

12. The lithographic plate according to claim 11 wherein the post-cure was effected by air-baking the developed plate at 500° F. for 5 minutes.

13. A process for preparing the lithographic printing plate of claim 1 which comprises imagewise exposing a light sensitive sheet material wherein said light sensitive sheet material comprises a sheet substrate upon which had been coated a first layer comprising a photosensitive lithographically suitable diazo compound and a second layer comprising a lithographically suitable photopolymerizable composition.

14. The process according to claim 13 wherein the photopolymerizable composition comprises the admixture of, in percent by weight of the photopolymerizable composition:

(a) an acrylonitrile butadiene styrene resin in an amount of from 2% to 25%; and (b) one or more resins selected from the group consisting of solid acrylic, polyurethane and polyamide resins in an amount of from 4% to 50%; and (c) cellulose acetate phthalate in an amount of from 4% to 50%; and (d) one or more ethylenically unsaturated monomeric or oligomeric compounds having on the average, more than one double bond, and being capable of forming a high polymer by free radical addition photopolymerization, in an amount of from 20% to 60%; and (e) a photoinitiator capable of generating free radicals in an amount of from 0.5% to 45%; and (f) p-phenol sulfonic acid sodium salt in an amount of from 0.4% to 5%.

* * * * *